United States Patent
Romero et al.

(10) Patent No.: US 12,176,862 B2
(45) Date of Patent: Dec. 24, 2024

(54) INDUCTIVE INTERFACE CIRCUITS HAVING RIPPLE-REDUCTION LOOPS

(71) Applicant: Allegro MicroSystems, LLC, Manchester, NH (US)

(72) Inventors: Hernán D. Romero, Buenos Aires (AR); Pablo Aguirre, Montevideo (UY)

(73) Assignee: Allegro MicroSystems, LLC, Manchester, NH (US)

( * ) Notice: Subject to any disclaimer, the term of this patent is extended or adjusted under 35 U.S.C. 154(b) by 143 days.

(21) Appl. No.: 18/051,934

(22) Filed: Nov. 2, 2022

(65) Prior Publication Data
US 2024/0146253 A1 May 2, 2024

(51) Int. Cl.
*H03F 1/26* (2006.01)
*G01D 5/20* (2006.01)
*H03F 3/189* (2006.01)

(52) U.S. Cl.
CPC ............ *H03F 1/26* (2013.01); *G01D 5/2053* (2013.01); *H03F 3/189* (2013.01); *H03F 2200/135* (2013.01); *H03F 2200/168* (2013.01); *H03F 2200/333* (2013.01); *H03F 2200/451* (2013.01); *H03F 2200/459* (2013.01)

(58) Field of Classification Search
None
See application file for complete search history.

(56) References Cited

U.S. PATENT DOCUMENTS

| | | | |
|---|---|---|---|
| 6,285,719 B1* | 9/2001 | Sobel | G01R 35/005 375/259 |
| 7,425,821 B2 | 9/2008 | Monreal et al. | |
| 7,605,647 B1 | 10/2009 | Romero et al. | |
| 7,990,209 B2 | 8/2011 | Romero | |
| 8,416,014 B2 | 4/2013 | Romero | |
| 8,453,518 B2 | 6/2013 | Diekmann et al. | |
| 9,817,083 B2 | 11/2017 | Romero | |
| 9,983,045 B2 | 5/2018 | O'Neill | |
| 10,330,499 B2 | 6/2019 | Elliott et al. | |

(Continued)

OTHER PUBLICATIONS

Renesas Electronics Corporation, "Inductive Position Sensor IC," ZMID5201/02/03 Datasheet; published Jul. 21, 2020; pp. 1-33; 33 pages.

*Primary Examiner* — Jas A Sanghera
(74) *Attorney, Agent, or Firm* — DALY, CROWLEY, MOFFORD & DURKEE, LLP (57) ABSTRACT

An amplifier circuits inductive/magnetic sensor interface can include a main signal path including one or more amplifiers configured to receive an input signal and to produce an output signal based on the input signal. The input signal may include a square-wave demodulated signal having an associated modulation frequency and an undesired frequency component at twice the modulation frequency of the square-wave demodulated signal. The amplifier circuit may include a gain feedback loop configured to set a gain of the amplifier circuit. The amplifier circuit may include a ripple reduction feedback loop configured to receive an intermediate signal on the main signal path and extract the undesired frequency component of the intermediate signal to produce a filtered version of the intermediate signal and provide the filtered version of the intermediate signal to the main signal path.

24 Claims, 5 Drawing Sheets

(56) References Cited

U.S. PATENT DOCUMENTS

| | | |
|---|---|---|
| 10,444,299 B2 | 10/2019 | Romero et al. |
| 10,481,219 B2 | 11/2019 | Romero |
| 10,837,943 B2 | 11/2020 | Romero |
| 11,047,933 B2 | 6/2021 | Romero et al. |
| 11,079,291 B2 | 8/2021 | Bertin |
| 11,112,275 B2 | 9/2021 | Bertin |
| 11,408,755 B2 | 8/2022 | Bertin |
| 11,428,755 B2 | 8/2022 | Latham et al. |
| 2008/0094055 A1* | 4/2008 | Monreal .................. G01D 3/02 324/117 H |
| 2017/0315146 A1* | 11/2017 | Koeck ..................... G01L 3/101 |
| 2019/0079146 A1* | 3/2019 | Romero ................ H10N 52/80 |
| 2019/0265018 A1* | 8/2019 | Latham .............. G01R 33/0017 |

* cited by examiner

INDUCTIVE INTERFACE CIRCUITS HAVING RIPPLE-REDUCTION LOOPS

BACKGROUND

Real-time position monitoring of movable objects is desirable in many applications. Examples include but are not limited to industrial manufacturing, automotive, and robotics applications. Some known positioning techniques include use of reflected magnetic fields to indicate position of a moveable object, or "target," that is typically part of or connected to a moveable component of a mechanical system. For such techniques, often referred to as "inductive" position sensing, a magnetic field is typically directed to and subsequently reflected from the target, with the reflected magnetic field including information about the position or motion of the target.

Inductive positioning techniques can use an inductive interface integrated circuit (ICs) to extract and condition electrical signals originating from an inductive sensor, such as a pick-up coil, acting as a receiver to detect the reflected magnetic field. In typical applications, an emitting coil produces a magnetic field, which is reflected from the moveable target and the reflected magnetic field is received by the pick-up coil. The pick-up coil typically converts the magnetic field-which may be carrying information, e.g., associated with a position of the target-into an electrical signal that is then input to the inductive interface IC for further signal processing. Such an inductive interface IC is typically used for demodulating and conditioning the input electrical signal that is representative of the encoding of information about the mechanical system, including the target, under interrogation by the transmitted magnetic field.

The magnetic fields used for such positioning techniques are typically sinusoidally modulated at relatively high frequencies in order to facilitate reflection of the transmitted magnetic field off of the target via the production of eddy currents in the target. As is known, the production of eddy currents, and resultant magnetic-field reflection, becomes more pronounced at higher frequencies. Use of higher frequencies allows the emitting coils to emit sufficiently significant magnetic fields so that the information of interest about the target, e.g., its position or motion, can be readily obtained.

Figure 1:
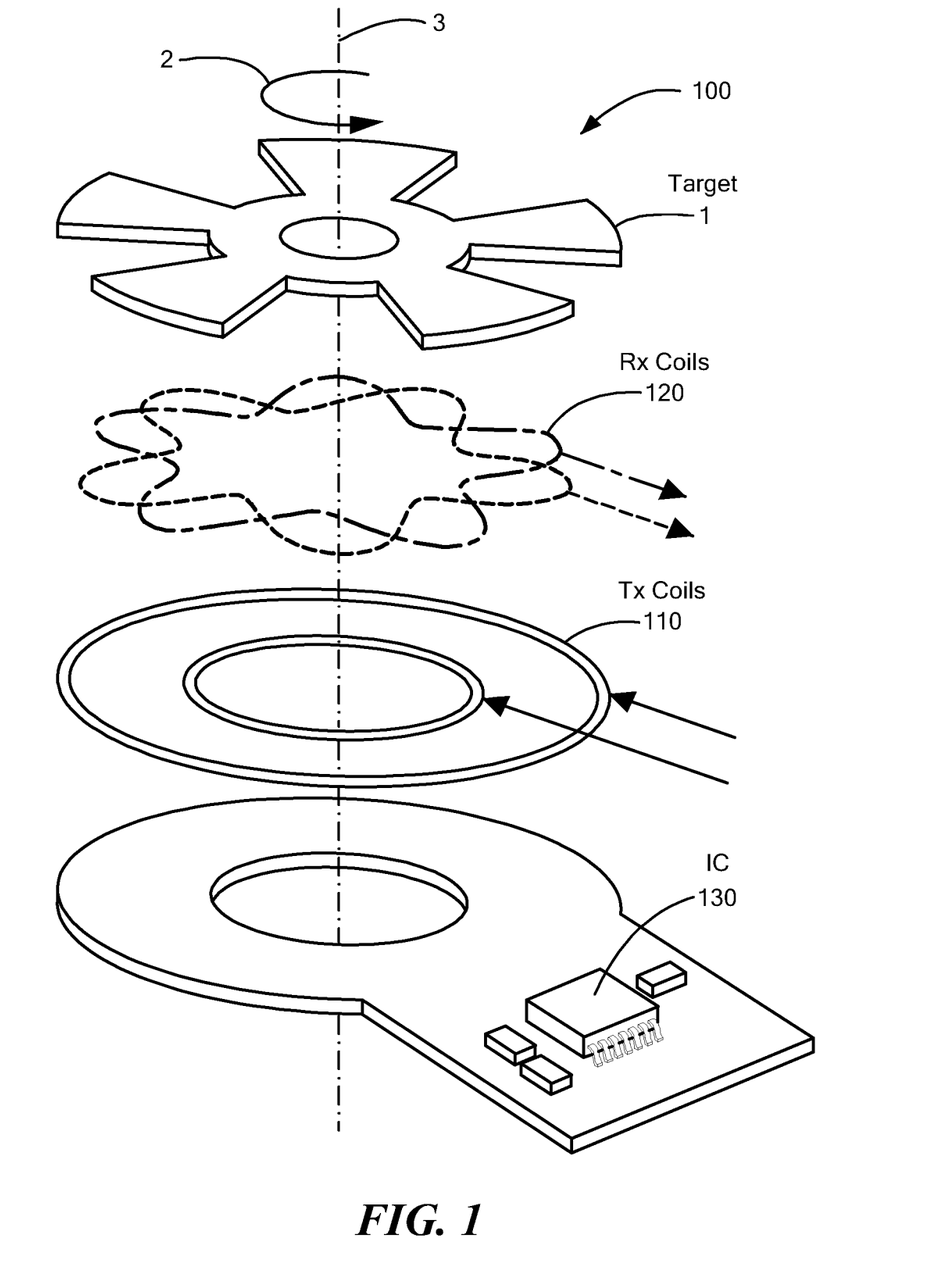
FIG. 1 is a diagram showing an example generalized rotary encoder.

FIG. 1 shows rotary encoder 100 used with a representative inductive interface IC. Rotary encoder 100 includes one or more transmitting (Tx) coils 110 (two are shown) and one or more receiving coil 120 (two are shown) that are positioned in proximity to a moveable target 1 shown with a direction of rotation 2 about an axis of rotation 3. An inductive interface integrated circuit (IC) 130 is shown connected to receiving coils 120.

The Tx coils 110 are excited by a driver to produce the "interrogation" magnetic field, which is directed to the target 1. Typically, one or more capacitors are used for the driver, in order to achieve resonance to maximize efficiency and minimize power consumption. The frequency of such sinusoidal oscillation is the carrier frequency ($f_{CARRIER}$) of the system. The target 1 is typically conductive and reflects the emitted magnetic field by the Tx Coil 110 onto the Rx coils 120. As shown, in some applications, the receiving coils 120 can be designed such they detect the reflected magnetic field with 90 degrees of phase difference (i.e., in quadrature). Consequently, IQ electrical signals are generated in each of the two Rx Coils. These signals may then be input to and conditioned by the inductive interface IC 130 separately in two channels, e.g., for angle calculation. The angle information is encoded as a modulated signal around the carrier frequency ($f_{CARRIER}$) used for the transmitted magnetic field.

Some prior inductive interface ICs 130 have relied on sinusoidal demodulators for a demodulation process inside the ICs 130. Such an approach has, however, presented problems with on-chip generation of in-phase high-resolution sinusoidal signals at sufficiently high frequencies, i.e., $f_{CARRIER}$, for coherent demodulation. Such an approach has also presented problems with linear multipliers used for demodulation (typically, Gilbert cells), which have limited input dynamic ranges compared to the large input dynamic ranges that are typically required for representing position or rotation variation of the target.

Some other prior inductive interface ICs 130 have relied on square-wave demodulation (SWD) at $f_{CARRIER}$ as an alternative technique for demodulating the incoming signal from the receiving coils (pickups) 120. When SWD is used to demodulate a sinusoidal carrier signal a significant high-frequency residual signal (residue) is typically generated at $2N*f_{CARRIER}(abs(N)>=1)$. Most of the energy of such residue will be concentrated at $2*f_{CARRIER}$.

Figure 2:
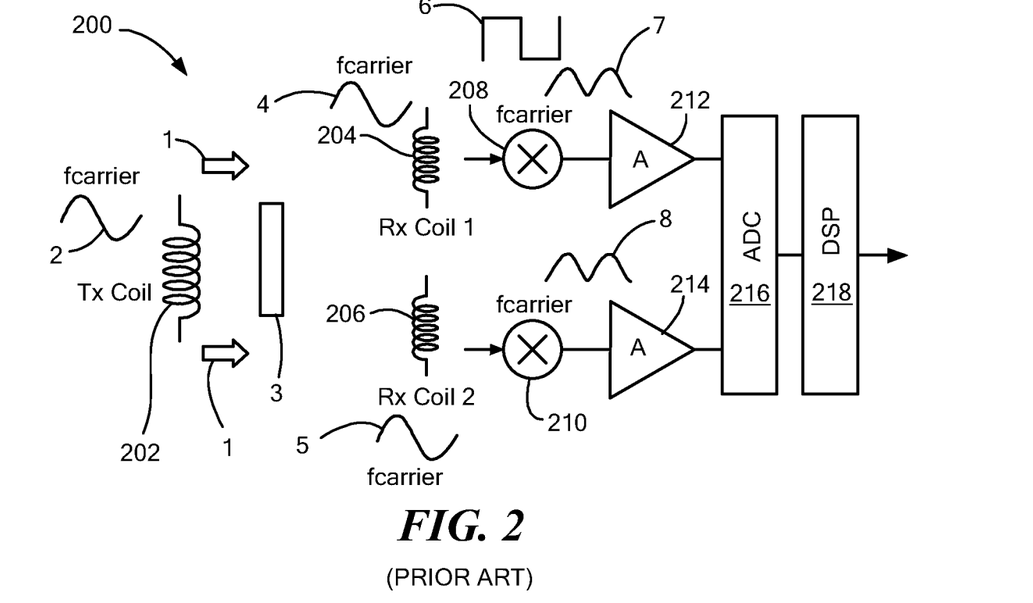
FIG. 2 is a diagram showing an example of a prior art inductive interface circuit implementing square wave demodulation.

FIG. 2 is a diagram showing an example of a prior art inductive interface circuit 200 implementing square wave demodulation. Transmitting coil 202 and receiving coils 204, 206 are shown. Circuit 200 incudes square-wave demodulators (SWDs) 208, 210 and amplifiers 212, 214. In operation, transmitting coil 202 emits magnetic field 1 with carrier frequency ($f_{CARRIER}$) 2 which is directed to target 3 and reflected as shown by reflected fields 4, 5. Receiving (pick-ups) coils 204, 206 receive the reflected fields 4,5 providing corresponding signals to square-wave demodulators 208, 210. Circuit 200 also includes analog-to-digital converter (ADC) 216 and digital signal processor 218, which can be used for determining position of target 3.

An in-phase (coherent) square wave (SW) signal 6, typically generated on-chip, is used for the square-wave demodulation (SWD). When multiplying the SW signal 6 by the sinusoidal carrier a rectified-sinusoidal signal is generated 7, 8. The desired information of signal is encoded in the amplitude of the sinusoidal carrier. After SWD, the useful signal is then encoded in the low frequency content of the rectified sinusoidal signal. The $2*f_{CARRIER}$ residue resulting from the SWD, however, places demanding requirements on an amplifier (e.g., 212, 214) used for circuit 200. In particular, circuit 200 is subject to a relatively high slew-rate requirement in order to cope with the high change in signal voltage with respect to time (dv/dt) conditions associated with the slope change in the rectified sinusoidal signal (shown at inflection points on 7, 8), including the previously-noted significant component at twice the carrier frequency ($2*f_{CARRIER}$). Such slew-rate limitations introduce significant non-linearity errors, degrading the overall linearity of the system.

Figure 3:
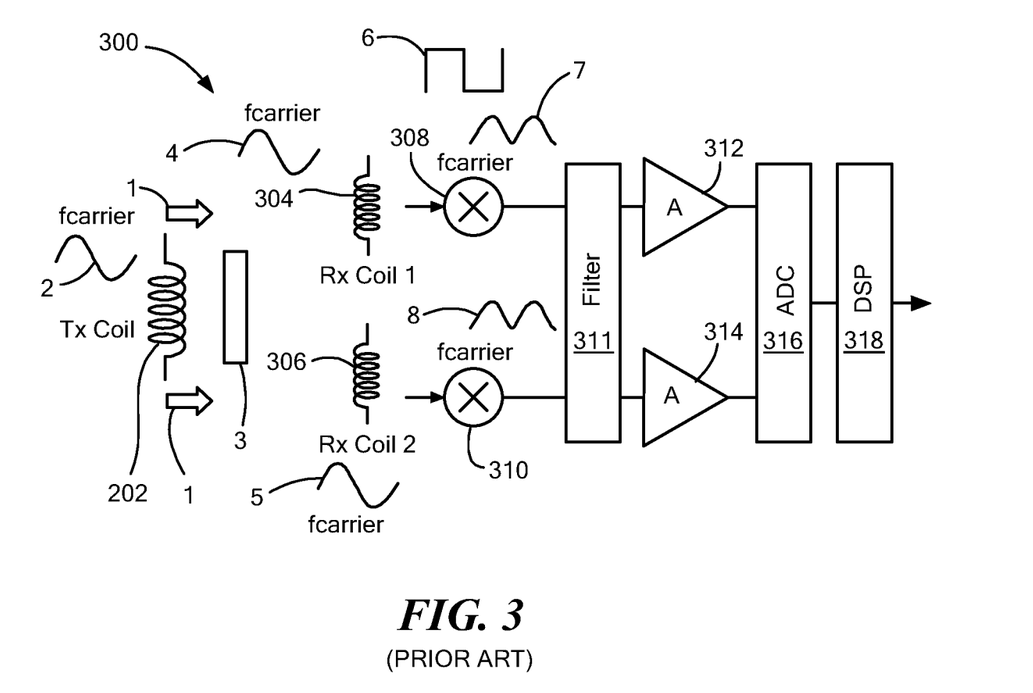
FIG. 3 is a diagram showing an example of a prior art inductive interface circuit implementing square wave demodulation used with a filter prior to the amplifier stage.

One way to cope with such slew-rate limitations is to implement a filter before the amplification stage, as shown in FIG. 3. FIG. 3 is a diagram showing an example of a prior art inductive interface circuit 300 implementing square wave demodulation used with a filter prior to the amplifier stage.

Circuit 300 includes transmitting coil 302 and receiving coils 304, 306 as shown. Circuit 300 further incudes square-wave demodulators (SWDs) 308, 310, filter 311, and amplifiers 312, 314. In operation, transmitting coil 302 emits magnetic field 1 with carrier frequency ($f_{CARRIER}$) 2 which is directed to target 3 and reflected as shown by reflected fields 4, 5. Receiving (pick-ups) coils 304, 306 receive the reflected fields 4,5 providing corresponding signals to square-wave demodulators 308, 310. Circuit 300 also includes analog-to-digital converter (ADC) 316 and digital signal processor 318, which can be used for determining position of target 3.

A main drawback with the approach utilized by circuit 300 is the excessive delay introduced by the filter 311, which again is intended to relax the amplifier requirements in terms of slew rate and thus maximize efficiency in terms of linearity. The production of such excessive delay may not be acceptable in many types of applications requiring minimum delay between input and output. Heavy filtering may not be desirable or acceptable in such applications. Additionally, such filtering before amplification will typically degrade the resulting SNR of the system, which may also be unacceptable in some applications. Such filtering can lead to another drawback arising from area impact (e.g., requirement of chip space), as such a filter is typically implemented as a passive filter.

SUMMARY

An aspect of the present disclosure includes an amplifier circuit for an inductive/magnetic sensor interface. In some examples, the amplifier circuit may be configured as, include, or be included in an integrated circuit (IC). The amplifier circuit may include a main signal path including a first amplifier configured to receive an input signal and to produce an output signal based on the input signal. The input signal may include a square-wave demodulated signal having an associated modulation frequency (e.g., corresponding to $f_{CARRIER}$) and an undesired frequency component at twice the modulation frequency (e.g., corresponding to $2*f_{CARRIER}$) of the square-wave demodulated signal. The amplifier circuit may include a gain feedback loop configured to receive the output signal and, based on the output signal, provide a feedback signal to the main signal path, where the gain feedback loop is configured to set a gain of the amplifier circuit. The amplifier circuit may include a ripple reduction feedback loop configured to receive an intermediate signal on the main signal path and extract the undesired frequency component of the intermediate signal to produce a filtered version of the intermediate signal, where the ripple reduction feedback loop is further configured to supply the filtered version of the intermediate signal to the main signal path.

Implementations may include one or more of the following features. The amplifier circuit may include a square wave demodulator configured to receive a sinusoidally modulated input signal and demodulate the sinusoidally modulated input signal by square-wave demodulation to produce a square-wave demodulated signal for use as the input signal of the main signal path, where the square-wave demodulated signal includes an undesired frequency component at twice the modulation frequency of the square-wave demodulated signal. The ripple reduction feedback loop may include a low-pass filter configured with a desired cutoff frequency. The desired cutoff frequency is below twice the modulation frequency of the square-wave-demodulated signal. The ripple reduction feedback loop may include a square-wave demodulator configured between the main signal path and the low-pass filter. The ripple reduction feedback loop may include a square-wave modulator configured between the low-pass filter and the main signal path. The ripple reduction feedback loop may include an amplifier disposed between the low-pass filter and the square-wave modulator. The first amplifier on the main signal path may include a transconductance amplifier. The main signal path may include a second amplifier. The second amplifier may be disposed on the main signal path between the output and a node where the ripple reduction feedback loop receives the intermediate signal. The amplifier circuit may include a pick-up coil configured to detect a magnetic field. The pick-up coil may be configured to detect a reflected sinusoidally modulated magnetic field. The amplifier circuit may include a processor configured to determine positional information of a moveable target from the output signal.

A further aspect includes an amplifier circuit for use with or as an inductive interface. In some examples, the amplifier circuit may be configured as, include, or be included in an integrated circuit. The amplifier circuit may include first and second ripple-reduction amplifier circuits configured to produce first and second output signals. Each ripple-reduction amplifier circuit may include a main signal path including a first amplifier configured to receive an input signal and to produce an output signal based on the input signal. The input signal may include a square-wave demodulated signal having an associated modulation frequency (e.g., corresponding to $f_{CARRIER}$) and an undesired frequency component at twice the modulation frequency (e.g., corresponding to $2*f_{CARRIER}$) of the square-wave demodulated signal.

The amplifier circuit may include a feedback loop configured to receive the output signal and, based on the output signal, provide a feedback signal to the main signal path. The amplifier circuit may include a ripple reduction feedback loop configured to receive an intermediate signal on the main signal path and extract the undesired frequency component of the intermediate signal to produce a filtered version of the intermediate signal, where the ripple reduction feedback loop is further configured to supply the filtered version of the intermediate signal to the main signal path. The amplifier circuit may further include a processor configured to determine sensor information from the output signals of the first and/or second ripple reduction amplifier circuits.

Implementations may include one or more of the following features. The amplifier circuit may include first and second square-wave demodulators, each configured to receive a sinusoidally modulated input signal from a respective receiver coil (pickup) and demodulate the sinusoidally modulated input signal by square-wave demodulation to produce a square-wave-demodulated signal, where the square-wave demodulated signal includes an undesired frequency component at twice the modulation frequency of the square-wave demodulated signal. The first and second square-wave demodulators may be configured to provide the input signals to the main signal paths of the first and second ripple reduction amplifier circuits, respectively. The amplifier circuit may include or be configured as an integrated circuit. The amplifier circuit may be configured for connection to (use with) an inductive/magnetic sensor, e.g., a coil or pickup. The amplifier circuit may include first and second pick-up coils, each configured to detect a magnetic field and provide an output signal to the first and second square-wave demodulators, respectively. Each pick-up coil may be configured to detect a reflected sinusoidally modulated magnetic field. The ripple reduction feedback loop of each ripple reduction amplifier circuit may include a low-pass filter configured with a desired cutoff frequency. The desired cutoff frequency may be, e.g., below twice the modulation frequency of the square-wave-demodulated signal of the input signal of each of the first and second ripple-reduction amplifier circuits.

The ripple reduction feedback loop of each ripple reduction amplifier circuit may include a square-wave demodulator configured between the main signal path and the low-pass filter. The ripple reduction feedback loop of each ripple reduction amplifier circuit may include a square-wave modulator configured between the low-pass filter and the main signal path. The ripple reduction feedback loop of each ripple reduction amplifier circuit may include an amplifier disposed between the low-pass filter and the square-wave modulator. The first amplifier on the main signal path of each ripple reduction amplifier circuit may include a transconductance amplifier. The main signal path of each ripple reduction amplifier circuit may include a second amplifier. Each second amplifier may be disposed on the respective main signal path between the output and a node where the corresponding ripple reduction feedback loop receives the intermediate signal. The processor may be configured to calculate an angle of rotation associated with a moveable target based on the first and second output signals. The processor may be configured to calculate a distance associated with a moveable target based on the first and second output signals. The processor may include a CORDIC processor or a processor configured to implement a CORDIC algorithm.

Other embodiments of the aspects and examples described may include corresponding computer systems, apparatus, and computer programs recorded on one or more computer storage devices, each configured to perform the actions of the methods as described herein. A computer system of one or more computers can be configured to perform particular operations or actions, as described herein, by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

An aspect of the present disclosure is directed to inductive interface circuits, including integrated circuits (ICs), that allow for square wave demodulation (SWD) and highly linear amplification of an originally sinusoidal-modulated signal of interest. Circuits and related techniques according to the present disclosure can allow for operating at higher frequencies (e.g., tens of MHz) compared to existing inductive interface ICs by, e.g., a factor of 10× or more. Some existing inductive interface ICs are capable of operating at a few MHz and may be limited from use at higher frequencies (e.g., tens of MHz) due to linearity issues presented by square-wave demodulation of a sinusoidal carrier. The higher frequencies of operation afforded by examples of the present disclosure offer benefits including a reduction in the area and cost of associated LC tanks in practical applications. In addition, ICs and techniques according to the present disclosure can introduce only negligible delay (and only related to the RRL, once settled, the carrier residues from demodulation are fully removed) as opposed to circuits utilizing a conventional filter before and/or after amplification by an amplification stage/circuit.

Figure 4:
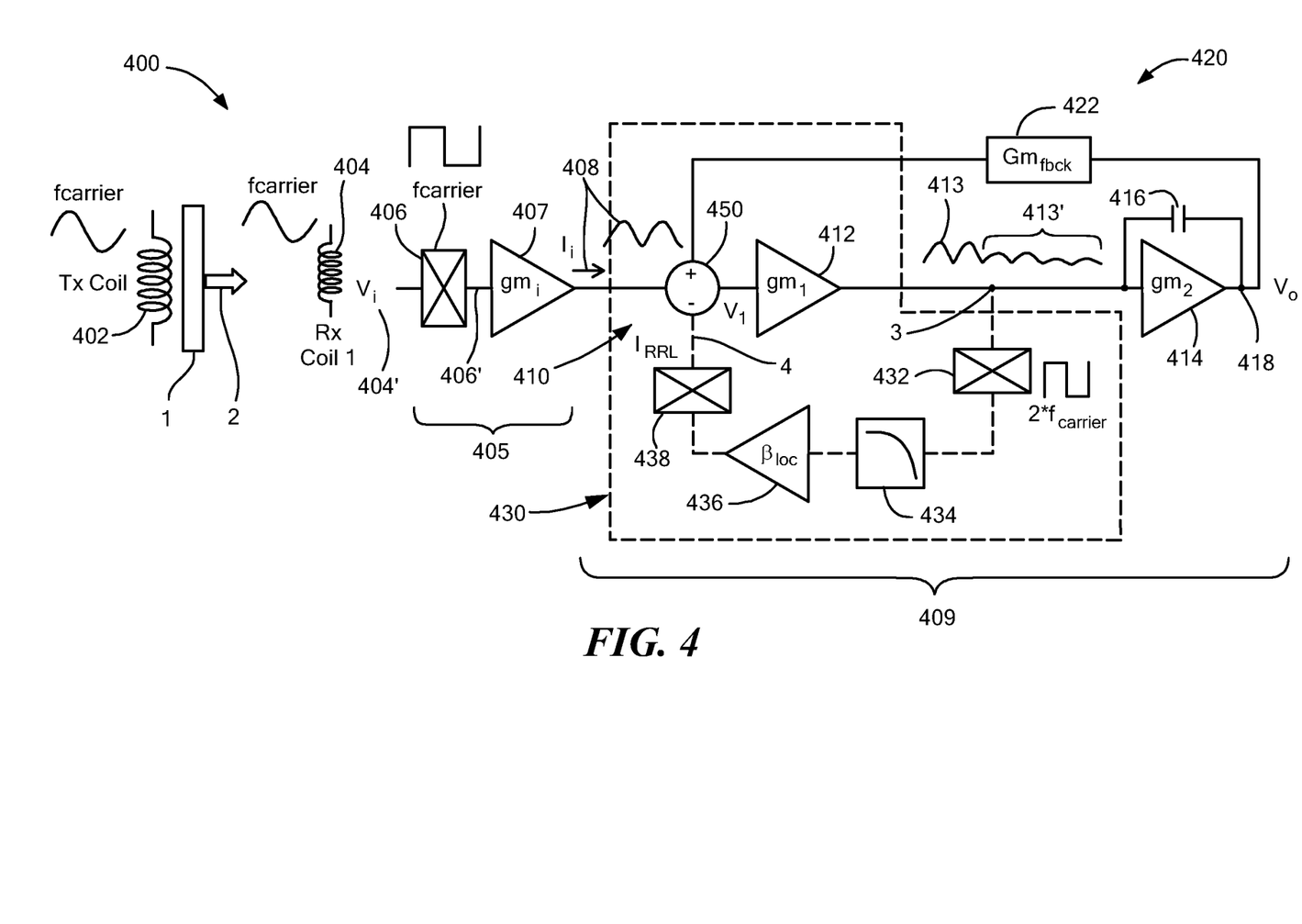
FIG. 4 is a diagram of an example inductive interface integrated circuit (IC) with a ripple reduction loop, in accordance with the present disclosure.

FIG. 4 is a diagram of an example inductive interface integrated circuit (IC) 400 with a ripple reduction loop, in accordance with the present disclosure. IC 400 may include or be connected to transmitter coil 402, which is configured to direct a magnetic field (e.g., having a sinusoidal modulation) to a target 1, to produce a reflected magnetic field 2, which is detected by receiver coil 404, which produces an output 404' (e.g., $V_i$). IC 400 is configured to receive signals (e.g., $V_i$) from receiver (pick up) coil 404. IC 400 may include or be connected to a square wave demodulation (SWD) section 405 having a square wave demodulator 406 and an amplifier 407. Square wave demodulator 406 is configured to receive the output signals from receiver coil 404 (at carrier modulation frequency, $f_{CARRIER}$), demodulate the signals using square wave demodulation and produce a corresponding output signal 406'. Although SWD is a coherent demodulation process, the multiplication operation for the SWD demodulation/modulation can be achieved by use of, e.g., cross-coupled switches, greatly reducing complexity compared to the use of linear multipliers typically required for coherent sinusoidal demodulation. While SWD may provide some gain loss, e.g., up to ~ 30%, compared to sinusoidal demodulation, in many cases this may be more than acceptable.

Amplifier (e.g., preamp) 407 can receive the output 406' from square wave demodulator 406 providing an input, e.g., input (input current $I_i$) 408, to amplifier circuit 409, which can include multiple circuit paths, e.g., forward path 410, feedback loop 420, and ripple-reduction feedback loop 430 as shown. Forward path 410 can be configured to receive input 408 and provide amplification with first amplifier 412. Forward path 410 can include second amplifier 414 and capacitor 416, e.g., configured in parallel with second amplifier 414, and an output 418 configured to provide an output signal ($V_O$). In some examples, the preamp 407, first amplifier 412, and second amplifier 414 may each include a transconductance amplifier; in other examples, one or more of those amplifiers may differ (e.g., may include a transimpedance amplifier, etc.). In some examples, one or more resistors can take the place of or substitute for amplifier 407. Feedback path 420 can receive output signal ($V_O$) from output 418 and provide it to forward path 410 at sum unit 450 to provide a desired amount of gain, indicated at gain element 422, e.g., to provide negative feedback for stability. In some examples, gain element 422 can include one or more amplifiers (e.g., op-amps) and/or one or more resistors, e.g., a single resistor. Output 418 can provide output signal $V_O$ to, e.g., an analog-to-digital converter (ADC) (not shown) and/or a processor, e.g., DSP, (not shown) for further signal processing, including for position and/or rotation calculation/determination.

As noted, IC 400 may further include a ripple reduction feedback loop 430, a.k.a., ripple reduction loop (RRL) 430 to remove or extract the undesired frequency component(s) resulting from (SWD). RRL 430 can receive a signal (intermediate signal) 413 on forward path 410, e.g., as shown by node or tap point 3 between sum unit 450 and output 418. RRL 430 is configured to operate as a local loop to extract one or more undesirable frequency components, e.g., at $2f_{CARRIER}$, produced by square wave demodulation (SWD) of the magnetic field signal received from the receiver (pick up) coil 404, which signal typically would be sinusoidally modulated.

Ripple reduction loop (RRL) 430 can be configured to receive signals on forward path 410 at a point between sum unit 450 and second amplifier 414 (intermediate signals on the forward path), such as from a node or tap point, e.g., shown at 3. RRL 430 can include square-wave demodulator (SWD) 432, low pass filter 434, amplifier 436, and SW modulator 438. RRL 430 can provide as an input, e.g., $I_{RRL}$, a filtered version of intermediate signal 413 to sum unit 450.

Square wave demodulator (SWD) 432 can be configured to demodulate the signal (e.g., intermediate signal) received from the forward path 410 at a desired demodulation frequency, e.g., twice the carrier frequency ($2f_{CARRIER}$) of the reflected magnetic field 2. As described below, RRL 430 can extract the undesired frequency components/content in signal 413 caused by the square wave demodulation and provide the component(s) as a feedback signal to sum unit 450 to subtract the components from signal 413, thereby producing smoothed-out signal 413' with a reduction in slew-rate changes (ripples).

Because signal 413 has the desired position information (of target 1) at baseband and also the undesired components at $2f_{CARRIER}$ and other even harmonics of $f_{CARRIER}$, SWD 432 operates to bring all the undesired components into baseband and, at the same time, shift the desired information to $2f_{CARRIER}$ (and other even harmonics). Then, low-pass filter (LPF) 434 filters out all the high frequency content (i.e., the desired information contained in 413) while keeping the undesired components (which are in baseband, at that point). The undesired signal components/content can be further processed by amplifier 436 and then shifted back to their original frequency position ($2f_{CARRIER}$ and other even harmonics) by square-waved demodulator (SWD) 438 acting as a modulator. After SWD 438, e.g., at location 4, the signal 408 is effectively reconstructed but without the desired information on baseband (e.g., encoded position information about target 1), and only including the high frequency, undesired content. The undesired content is then provided to sum unit 450, which subtracts the undesired content from signal 413. When subtracting the undesired content from 408 using sum unit 450,413 is modified to produce 413', i.e., desired baseband information with no (or reduced) high frequency content produced by the square-wave demodulation performed by SWD 406.

Accordingly, RRL 430 can operate to extract or attenuate undesirable frequency components produced by square wave demodulation (by square wave demodulator 406) of the reflected magnetic field signal 404' (which may be sinusoidally modulated) from pick-up coil 404. Settling of the filtered intermediate signal, with decreasing amplitude of residues from square wave demodulation, is indicated by signal portion 413'.

Figure 5:
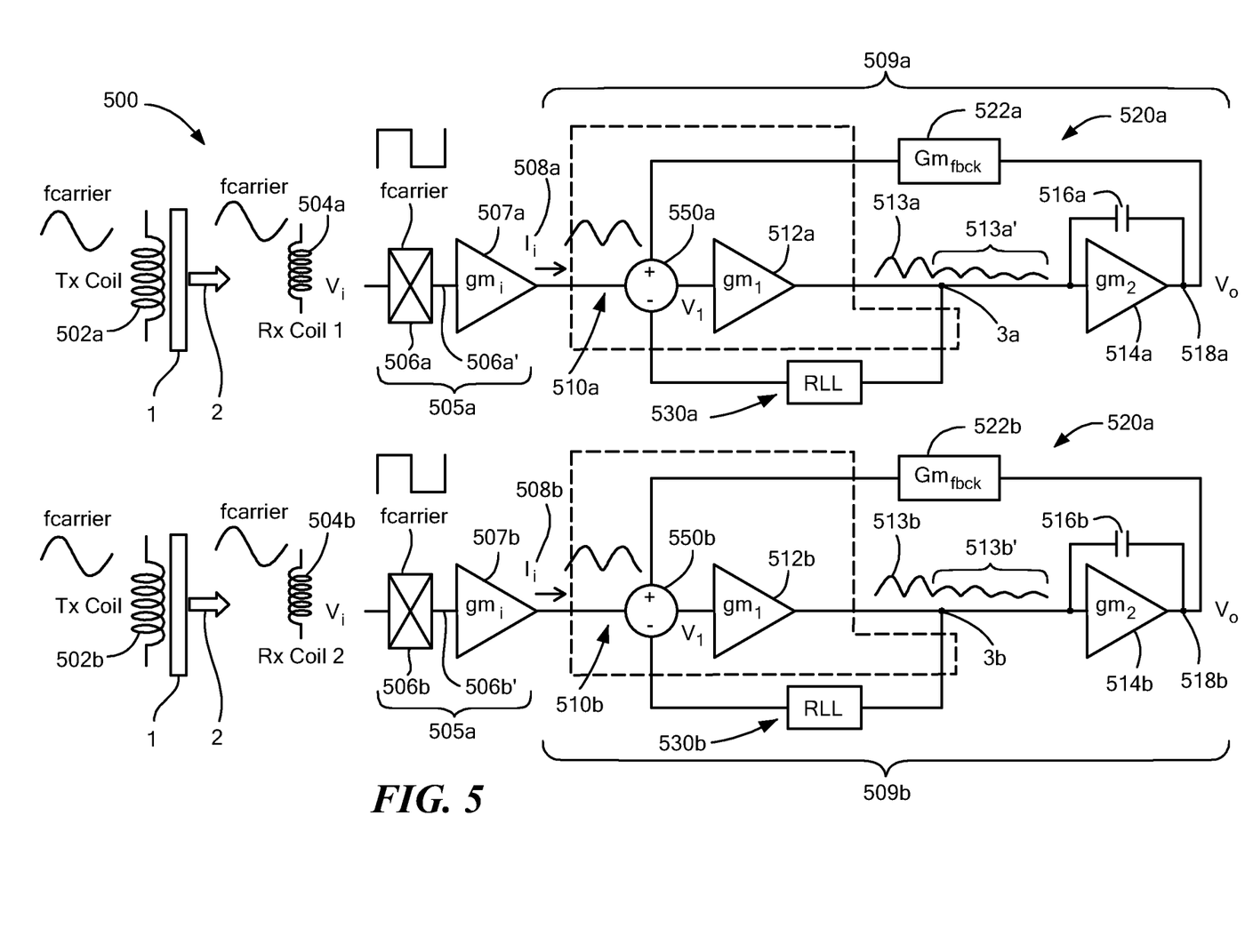
FIG. 5 is a diagram of an example inductive interface integrated circuit (IC) with first and second amplifier circuits having ripple-reduction loops (RRLs), in accordance with the present disclosure.

FIG. 5 is a diagram of an example inductive interface integrated circuit (IC) 500 with first and second amplifier circuits having ripple-reduction loops (RRLs), in accordance with the present disclosure. IC 500 is generally similar to IC 400 of FIG. 4 but has two amplifier circuits 509a-b (as opposed to one). The first and second amplifier circuits 509a-b include, respectively, forward paths 510a-b, feedback loops 520a-b, and RRL loops 530a-b, respectively. In some examples, the two amplifier circuits 509a-b can process signals having a relative phase difference between them, e.g., $\pi/2$ radians, corresponding to in-phase (I) and quadrature phase (Q) signals.

IC 500 may include or be connected to transmitter coil 502, which may include a single coil 502 or multiple coils 502a-b, and receiver coils 504a-b. Transmitter coil(s) 502 can be configured to direct a magnetic field (e.g., having a sinusoidal modulation) to a target 1, to produce a reflected magnetic field 2, which is detected by receiver coils 504a-b. IC 500 is configured to receive signals (e.g., V) from receiver (pick up) coils 504a-b. IC 500 may include or be connected to square wave demodulation sections 505a-b having square wave demodulators 506a-b and amplifiers 507a-b, respectively. Square wave demodulators 506a-b are configured to receive the output signals (at carrier modulation frequency, $f_{CARRIER}$) from receiver coils 504a-b, respectively, demodulate the signals using square-wave demodulation, and produce corresponding output signals 506a'-b'. Amplifiers (e.g., preamp) 507a-b can receive the outputs 506a'-b' from square wave demodulators 506a-b, respectively, providing inputs, e.g., inputs (input currents $I_i$) 508a-b, to amplifier circuits 509a-b, which can include multiple circuit paths, e.g., forward path 510a-b, feedback loops 520a-b, and ripple-reduction feedback loops 530a-b, as shown.

Forward paths 510a-b can be configured to receive inputs 508a-b and provide amplification with first amplifiers 512a-b. Forward paths 510a-b can include second amplifiers 514a-b and capacitor 516a-b, e.g., configured in parallel with second amplifiers 514a-b, and provide output signals ($V_{O_1}$-$V_{O_2}$) at outputs 518a-b, respectively. In some examples, preamps 507a-b, first amplifiers 512a-b, and second amplifiers 514a-b may each include a transconductance amplifier; in other examples, one or more of those amplifiers may differ (e.g., may include a transimpedance amplifier, etc.). Feedback paths 520a-b can receive signals ($V_{O_1}$-$V_{O_2}$) from outputs 518 and provide them, respectively, to forward paths 510a-b at sum unit 550a-b to provide a desired amount of gain, indicated at 522a-b, e.g., to provide negative feedback for stability. Outputs 518a-b can provide output signals ($Vo_1$-$Vo_2$) to, e.g., one or more analog-to-digital converters (ADCs) and/or processors (e.g., DSPs) for further signal processing. For example, an ADC (not shown) can receive the output signals and provide corresponding digital signals to a DSP, e.g., programmed for coordinate rotation digital computer (CORDIC) processing, to determine angular and/or linear position of the target 1.

As noted, amplifier circuits 509a-b of IC 500 may further include ripple reduction feedback loops 530a-b, a.k.a., ripple reduction loops (RRLs) 530a-b. RRLs 530a-b can receive signals (intermediate signals) 513a-b on forward paths 510a-b, e.g., as shown by nodes or tap points 3a-b between sum units 550a-b and outputs 518a-b. RRLs 530a-b are configured to operate as local loops to extract one or more undesirable frequency components produced by square wave demodulation of the magnetic field signal received from the receiver (pick up) coils 504a-b, which typically would be sinusoidally modulated.

Ripple reduction loops (RRLs) 530a-b can be configured to receive intermediate signals 513a-b on forward paths 510a-b at points between sum units 550a-b and second amplifiers 514a-b, such as from nodes or tap points, e.g., shown at 3a-b. Each RRL 530a-b can include a square-wave demodulator (SWD), low-pass filter, amplifier, and square-wave modulator, e.g., as shown in FIG. 4 by SWD 432, low-pass filter 434, amplifier 436, and SWD 438 configured as a modulator. RRLs 530a-b can provide as inputs, e.g., $I_{RRL}$, filtered versions of intermediate signal 513a-b to sum units 550a-b. The square wave demodulators can be configured to demodulate the signals (e.g., intermediate signals) received from the forward paths 510a-b at a desired demodulation frequency, e.g., twice the carrier frequency ($2F_{CARRIER}$) of the reflected magnetic field 2.

As described above, after the SWD process in RRLs 530a-b, the undesired frequency component(s)/content is/are at baseband and the desired information/content is shifted to $2f_{CARRIER}$ (and other even harmonics of $f_{CARRIER}$). Because signals 513a-b have the desired position information (of target 1) at baseband and also the undesired components at $2f_{CARRIER}$ and other even harmonics of $f_{CARRIER}$, the first (initial) SWD of each RRL 530a-b operates to bring all the undesired components into baseband and, at the same time, shift the desired information to $2f_{CARRIER}$ (and other even harmonics). Then, the low-pass filter (LPF) of each RRL 530 filters out all the high frequency content (i.e., the desired information contained in 513a-b) while keeping the undesired components (which are in baseband, at that point). The undesired signal components/content can be further processed by the amplifier of each RRL 530a-b and then shifted back to their original frequency position ($2f_{CARRIER}$ and other even harmonics) by the second square-waved demodulator (acting as a modulator) of each RRL 530a-b. After the second SWDs, the signals 508a-b are effectively reconstructed but without the desired information on baseband (e.g., encoded position information about target 1), and only including the high frequency, undesired content. The undesired content is then provided to sum units 550a-b, which subtract the undesired content from signals 513a-b. When subtracting the undesired content from 508a-b using sum units 550a-b, intermediate signals 513a-b are modified to produce smoothed signals 513a'-b', i.e., desired baseband information with no (or reduced) high frequency content produced by the square-wave demodulation performed by SWDs 506a-b.

Figure 6:
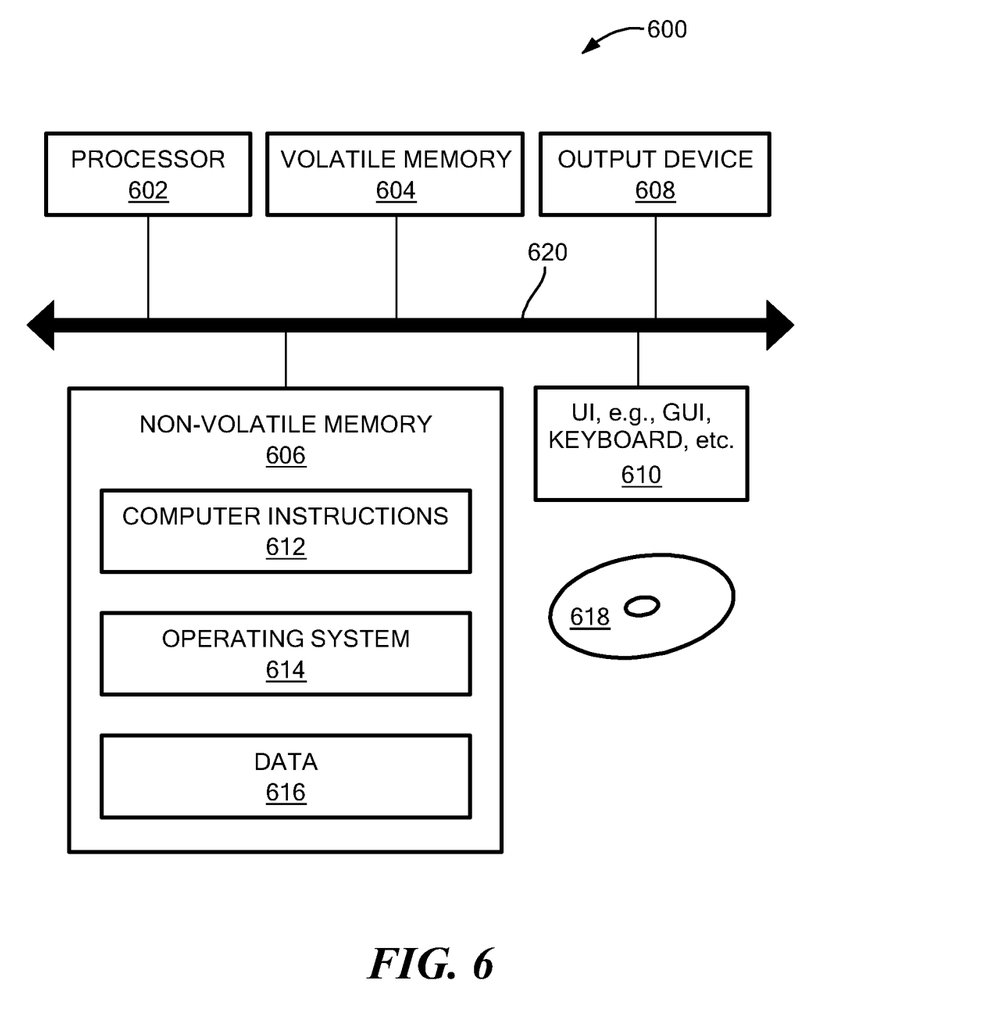
FIG. 6 is a block diagram of an example computer system operative to perform processing, in accordance with the present disclosure.

FIG. 6 is a block diagram of an example computer system 600 operative to perform processing, in accordance with the present disclosure. Computer system 600 can perform all or at least a portion of the processing, e.g., steps in the algorithms and methods, described herein. The computer system 600 includes a processor 602, a volatile memory 604, a non-volatile memory 606 (e.g., hard disk), an output device 608 and a user input or interface (UI) 610, e.g., graphical user interface (GUI), a mouse, a keyboard, a display, and/or any common user interface, etc. The non-volatile memory (non-transitory storage medium) 606 stores computer instructions 612 (a.k.a., machine-readable instructions or computer-readable instructions) such as software (computer program product), an operating system 614 and data 616. In some examples/embodiments, the computer instructions 612 can be executed by the processor 602 out of (from) volatile memory 604. In some examples/embodiments, an article 618 (e.g., a storage device or medium such as a hard disk, an optical disc, magnetic storage tape, optical storage tape, flash drive, etc.) includes or stores the non-transitory computer-readable instructions. Bus 620 is also shown.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 600 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. The programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit). In some examples, digital logic circuitry, e.g., one or more FPGAs, can be operative as a processor as described herein.

Accordingly, embodiments of the inventive subject matter can afford various benefits relative to prior art techniques. For example, embodiments and examples of the present disclosure can enable or facilitate e.g., systems and components achieving or obtaining an Application Safety Integration Level (ASIL) in accordance with a safety standard such as ISO 26262.

Various embodiments of the concepts, systems, devices, structures, and techniques sought to be protected are described above with reference to the related drawings. Alternative embodiments can be devised without departing from the scope of the concepts, systems, devices, structures, and techniques described.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. An amplifier circuit for an inductive sensor interface, the amplifier circuit comprising:
   a main signal path including a first amplifier configured to receive an input signal and to produce an output signal at an output based on the input signal, wherein the input signal comprises a square-wave demodulated signal having an associated modulation frequency and an undesired frequency component at twice the modulation frequency;
   a gain feedback loop configured to receive the output signal and, based on the output signal, provide a feedback signal to the main signal path, wherein the gain feedback loop is configured to set a gain of the amplifier circuit; and
   a ripple reduction feedback loop configured to receive an intermediate signal on the main signal path and extract the undesired frequency component of the intermediate signal to produce a filtered version of the intermediate signal, wherein the ripple reduction feedback loop is further configured to supply the filtered version of the intermediate signal to the main signal path, wherein the ripple reduction feedback loop comprises a low-pass filter configured with a desired cutoff frequency, wherein the ripple reduction feedback loop comprises a square-wave demodulator configured between the main signal path and the low-pass filter, and wherein the ripple reduction feedback loop comprises a square-wave modulator configured between the low-pass filter and the main signal path.

2. The amplifier circuit of claim 1, further comprising a square wave demodulator configured to receive a sinusoidally modulated input signal and demodulate the sinusoidally modulated input signal to produce a square-wave demodulated signal for use as the input signal of the main signal path, wherein the square-wave demodulated signal includes a frequency component at twice the modulation frequency of the square-wave demodulated signal.

3. The amplifier circuit of claim 1, wherein the desired cutoff frequency is below twice the modulation frequency of the square-wave-demodulated signal.

4. The amplifier circuit of claim 1, wherein the ripple reduction feedback loop comprises an amplifier disposed between the low-pass filter and the square-wave modulator.

5. The amplifier circuit of claim 1, wherein the amplifier circuit comprises an integrated circuit.

6. The amplifier circuit of claim 1, wherein the first amplifier on the main signal path comprises a transconductance amplifier.

7. The amplifier circuit of claim 1, wherein the main signal path comprises a second amplifier.

8. The amplifier circuit of claim 7, wherein the second amplifier is disposed on the main signal path between the output and a node where the ripple reduction feedback loop receives the intermediate signal.

9. The amplifier circuit of claim 1, further comprising a pick-up coil configured to detect a magnetic field.

10. The amplifier circuit of claim 9, wherein the pick-up coil is configured to detect a reflected sinusoidally modulated magnetic field.

11. The amplifier circuit of claim 1, further comprising a processor configured to determine positional information of a moveable target from the output signal.

12. An amplifier circuit comprising:
   (A) first and second ripple-reduction amplifier circuits configured to produce first and second output signals, each ripple-reduction amplifier circuit including,
      a main signal path including a first amplifier configured to receive an input signal and to produce an output signal at an output based on the input signal, wherein the input signal comprises a square-wave demodulated signal having an associated modulation frequency and an undesired frequency component at twice the modulation frequency;
      a feedback loop configured to receive the output signal and, based on the output signal, provide a feedback signal to the main signal path;
      a ripple reduction feedback loop configured to receive an intermediate signal on the main signal path and extract the undesired frequency component of the intermediate signal to produce a filtered version of the intermediate signal, wherein the ripple reduction feedback loop is further configured to supply the filtered version of the intermediate signal to the main signal path, wherein the ripple reduction feedback loop comprises a low-pass filter configured with a desired cutoff frequency, wherein the ripple reduction feedback loop comprises a square-wave demodulator configured between the main signal path and the low-pass filter, and wherein the ripple reduction feedback loop comprises a square-wave modulator configured between the low-pass filter and the main signal path; and
   (B) a processor configured to determine sensor information from the output signals of the first and second ripple-reduction amplifier circuits.

13. The amplifier circuit of claim 12, further comprising first and second square-wave demodulators, each configured to receive a sinusoidally modulated input signal and demodulate the sinusoidally modulated input signal to produce a square-wave-demodulated signal, wherein the square-wave demodulated signal includes a frequency component at twice the modulation frequency of the square-wave demodulated signal, and wherein the first and second square-wave demodulators are configured to provide the input signals to the main signal paths of the first and second ripple-reduction amplifier circuits, respectively.

14. The amplifier circuit of claim 13, further comprising first and second pick-up coils configured to detect a magnetic field and provide output signals to the first and second square-wave demodulators, respectively.

15. The amplifier circuit of claim 14, wherein each pick-up coil is configured to detect a reflected sinusoidally modulated magnetic field.

16. The amplifier circuit of claim 12, wherein the desired cutoff frequency is below twice the modulation frequency of the square-wave demodulated signal of the input signal of each of the first and second ripple-reduction amplifier circuits.

17. The amplifier circuit of claim 12, wherein the ripple reduction feedback loop comprises an amplifier disposed between the low-pass filter and the square-wave modulator.

18. The amplifier circuit of claim 12, wherein the amplifier circuit comprises an integrated circuit.

19. The amplifier circuit of claim 12, wherein the first amplifier on the main signal path comprises a transconductance amplifier.

20. The amplifier circuit of claim 12, wherein the main signal path comprises a second amplifier.

21. The amplifier circuit of claim 20, wherein the second amplifier is disposed on the main signal path between the output and a node at which the ripple reduction feedback loop receives the intermediate signal.

22. The amplifier circuit of claim 12, wherein the processor is configured to calculate an angle of rotation associated with a moveable target based on the first and second output signals.

23. The amplifier circuit of claim 12, wherein the processor is configured to calculate a distance associated with a moveable target based on the first and second output signals.

24. The amplifier circuit of claim 12, wherein the processor comprises a CORDIC processor.

* * * * *

UNITED STATES PATENT AND TRADEMARK OFFICE
CERTIFICATE OF CORRECTION

| | |
|---|---|
| PATENT NO. | : 12,176,862 B2 |
| APPLICATION NO. | : 18/051934 |
| DATED | : December 24, 2024 |
| INVENTOR(S) | : Hernán D. Romero et al. |

Page 1 of 1

It is certified that error appears in the above-identified patent and that said Letters Patent is hereby corrected as shown below:

In the Specification

Column 8, Line 10, delete "from 408 using sum unit 450,413" and replace with --from signal 408 using sum unit 450, signal 413--.

Column 8, Line 40, delete "(e.g., V)" and replace with --(e.g., $V_i$)--.

Column 9, Line 48, delete "RRL 530" and replace with --RRL 530a-b--.

Signed and Sealed this
Twenty-fourth Day of June, 2025

Coke Morgan Stewart
*Acting Director of the United States Patent and Trademark Office*